United States Patent
Harada et al.

(10) Patent No.: US 6,938,332 B2
(45) Date of Patent: Sep. 6, 2005

(54) METHOD FOR MANUFACTURING MULTILAYER CERAMIC SUBSTRATES

(75) Inventors: Hideyuki Harada, Omihachiman (JP); Hiromichi Kawakami, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 388 days.

(21) Appl. No.: 10/183,497

(22) Filed: Jun. 28, 2002

(65) Prior Publication Data

US 2003/0000079 A1 Jan. 2, 2003

(30) Foreign Application Priority Data

Jun. 29, 2001 (JP) ........................................ 2001-199253

(51) Int. Cl.⁷ ............................................... H05K 3/36
(52) U.S. Cl. ............................ 29/830; 29/831; 29/846; 29/849; 29/851; 29/852; 156/89.12; 156/182; 156/263; 427/97.2
(58) Field of Search ............................... 29/25.41, 25.42, 29/412, 417, 602.1, 830, 831, 846, 847–853; 174/256–261; 156/89.12, 89.16–89.18; 428/141, 195.1, 209; 427/96.8, 97.2, 98.3, 99.4; 430/312

(56) References Cited

U.S. PATENT DOCUMENTS 5,625,935 A * 5/1997 Kubota et al. ............. 29/25.42
5,847,326 A * 12/1998 Kawakami et al. ......... 174/256
5,858,145 A * 1/1999 Sreeram et al. ............. 29/851
5,876,536 A * 3/1999 Kumar et al. ............ 156/89.12

FOREIGN PATENT DOCUMENTS

| JP | 07-099263 | 4/1995 |
| JP | 2000-176928 | 6/2000 |

* cited by examiner

*Primary Examiner*—Minh Trinh
*Assistant Examiner*—Donghai D. Nguyen
(74) *Attorney, Agent, or Firm*—Dickstein, Shapiro, Morin & Oshinsky, LLP

(57) ABSTRACT

A method for manufacturing multilayer ceramic substrates in accordance with a multiple formation method using a non-shrinkage process allows the multilayer ceramic substrates to be smoothly formed by dividing a sintered multilayer mother substrate, and in addition, external terminal electrodes in a preferable state can be efficiently formed. When a green composite laminate comprising shrinkage suppression layers and a green multilayer mother substrate provided therebetween is formed, through-holes are provided on dividing lines so as to divide conductors, and in addition, cut-in grooves are provided along the dividing lines. After the shrinkage suppression layers are removed from the fired composite laminate, the multilayer ceramic substrates are obtained by dividing the multilayer mother substrate along the through-holes and the cut-in grooves. Conductors, which are formed into the external terminal electrodes, are exposed on parts of side surfaces of the multilayer ceramic substrate corresponding to parts of the inside surfaces of the through-holes.

18 Claims, 12 Drawing Sheets

METHOD FOR MANUFACTURING MULTILAYER CERAMIC SUBSTRATES

BACKGROUND OF THE INVENTION

1. Field of the Invention

The present invention relates to methods for manufacturing multilayer ceramic substrates, and more particularly, relates to a method for manufacturing a plurality of multilayer ceramic substrates, which comprises a step of forming a multilayer mother substrate and a subsequent step of dividing the multilayer mother substrate so as to obtain the plurality of multilayer ceramic substrates.

2. Description of the Related Art

Multilayer substrates are formed of a plurality of ceramic layers laminated to each other. The multilayer ceramic substrates are provided with various types of wiring conductors. As the wiring conductors, for example, internal conductive films extending along predetermined interfaces between ceramic layers or via hole conductors penetrating through predetermined ceramic layers may be formed inside the multilayer ceramic substrates, and external conductive films extending on the external surfaces of the multilayer ceramic substrates may also be formed.

The multilayer ceramic substrate is used for mounting semiconductor chip elements and other chip elements thereon and is also used for connecting these electronic elements to each other. The wiring conductors are used as electrical paths for forming interconnection among these elements.

In addition, passive elements such as a capacitor element or an inductor element may be formed inside the multilayer ceramic substrate in some cases. These passive elements may be formed of parts of the internal conductive films or the via hole conductors described above.

The multilayer ceramic substrates are used as, for example, LCR hybrid high-frequency devices in the field of mobile communication terminal apparatuses; composite devices formed of active elements, such as a semiconductor IC chip, and passive elements, such as a capacitor, an inductor or a resistor, in the field of computers; or simple semiconductor IC packages.

In particular, the multilayer ceramic substrates have been widely used for forming various electronic devices, such as power amplifier (PA) module substrates, radio-frequency (RF) diode switches, filters, chip antennas, various package devices and hydride devices.

In order to form a multilayer ceramic substrate having enhanced multifunctionality, higher integration density and improved performance, it is effective that the wiring conductors be densely formed.

Since a firing step must be performed in order to obtain the multilayer ceramic substrate, the shrinkage of the ceramic caused by firing occurs in three directions X, Y, and Z. The shrinkage is likely to occur nonuniformly in the entire multilayer ceramic substrate, and the dimensions between the X direction and the Y direction may become different by approximately 0.4% to 0.6%. As a result, warping of the multilayer ceramic substrate occurs. Consequently, the positional accuracy of external conductive films may be degraded, and in addition, undesired deformations, strains or disconnections of internal wiring conductors may also occur in some cases. These defects in the wiring conductors interfere with the trend towards higher wiring density of conductors described above.

Accordingly, a so-called non-shrinkage process has been proposed in which the firing shrinkage in the direction parallel to the main surface can be substantially prevented in when a multilayer ceramic substrate is formed.

In a method for manufacturing a multilayer ceramic substrate by the non-shrinkage process, a low-temperature sinterable ceramic powder which is sinterable at a temperature of, for example, 1,000° C. or less is prepared as an insulating ceramic material, and in addition, an inorganic powder which functions to suppress the shrinkage and which is not sintered at the sintering temperature of the low-temperature sinterable ceramic powder is also prepared. When a green laminate which will be fired to form the desired multilayer ceramic substrate is produced, shrinkage suppression layers containing the non-sinterable ceramic are disposed so as to sandwich a plurality of ceramic green sheets which are laminated to each other and which contain the low-temperature sinterable ceramic material, and on which the ceramic green sheets, wiring conductors are provided.

The green laminate thus formed is then fired. During this firing step, reaction layers approximately 2 to 3 $\mu$m thick are formed at the interface portions between the ceramic green layers and the shrinkage suppression layers, and each reaction layer serves to adhere the ceramic green sheet and the shrinkage suppression layer to each other. In addition, the shrinkage does not substantially occur in the shrinkage suppression layer since the inorganic powder contained in the shrinkage suppression layer is not substantially sintered. Accordingly, the shrinkage suppression layers restrain the ceramic green layers from shrinking, and hence, the ceramic green layers substantially shrink only in the Z direction, that is, the thickness direction, but are restrained from shrinking in the X and the Y directions, that is, the direction parallel to the main surface. As a result, the multilayer ceramic substrate described above obtained by firing the green laminate is not susceptible to nonuniform deformation, the warpage thereof is decreased, the defects of the wiring conductors described above are unlikely to occur, and hence, higher wiring density of the conductors can be realized.

The shrinkage suppression layers described above are removed after firing.

When a multilayer ceramic substrate is produced, a so-called multiple formation method is used in order to increase the production efficiency and comprises a step of forming a multilayer mother substrate which includes a plurality of multilayer ceramic substrates and a step of dividing this multilayer mother substrate along predetermined dividing lines so as to obtain the plurality of multilayer ceramic substrates.

In order to efficiently divide a multilayer mother substrate in the multiple formation method, the multilayer mother substrate preferably has cut-in grooves along predetermined dividing lines. In the case in which the cut-in grooves are provided in accordance with a so-called chocolate break configuration, the multilayer mother substrate may be divided along the predetermined dividing lines when simply bent.

In the multiple formation method, the shrinkage in a firing step is also likely to occur nonuniformly in the whole multilayer mother substrate, the dimensions between the X direction and the Y direction may become different from each other, and warping of the multilayer mother substrate may occur in some cases. Accordingly, the non-shrinkage process described above is preferably used in the multiple formation methods.

In Japanese Patent No. 2856045, a green composite laminate 4 provided with cut-in grooves 6 is disclosed, the green composite laminate 4 comprising first and second shrinkage suppression layers 2 and 3 and a green (i.e., an unfired state) multilayer mother substrate 1 provided therebetween, as shown in FIG. 1 hereof.

Wiring conductors provided for the green multilayer mother substrate 1 are not shown in FIG. 19, and the dimension in the thickness direction thereof is exaggeratedly in the figure.

The green multilayer mother substrate 1 comprises a plurality of ceramic green layers 7 containing an insulating ceramic powder such as a low-temperature sinterable ceramic powder, and these ceramic green layers 7 are formed of a plurality of ceramic green sheets laminated to each other.

The shrinkage suppression layers 2 and 3 contain an inorganic powder that is not sintered at the sintering temperature of the insulating ceramic powder of layers 7. The first and the second shrinkage suppression layers 2 and 3 are each formed of, for example, a predetermined number of inorganic material green sheets 8 which contain an inorganic material and which are laminated to each other.

In order to form the green composite laminate 4, the green multilayer mother substrate 1 is first formed. Next, cut-in grooves 6 are formed in at least one of the major surface sides the green multilayer mother substrate 1. When the cut-in grooves 6 are formed, the green multilayer mother substrate 1 is compressed in the lamination direction of the formed cut-in grooves 6 in order to avoid displacement that may occur among the plurality of ceramic green layers 7.

Next, the first and the second shrinkage suppression layers 2 and 3 are formed by laminating the inorganic material green sheets 8 so as to sandwich the green mother substrate 1, and as a result, the green composite laminate 4 is formed. Subsequently, the whole green composite laminate 4 is again compressed in the lamination direction.

Next, the green composite laminate 4 is fired under the conditions in which the insulating ceramic powder contained in the ceramic green layers 7 is sintered and the inorganic powder contained in the shrinkage suppression layers 2 and 3 is not sintered. Accordingly, the sintered multilayer mother substrate 1 provided between the first and the second shrinkage suppression layers 2 and 3 is obtained. Subsequently, the shrinkage suppression layers 2 and 3 are removed, and hence, the sintered multilayer mother substrate 1 is obtained.

Next, the sintered multilayer mother substrate 1 is divided along the cut-in grooves 6, and hence, the plurality of multilayer ceramic substrates is formed.

In addition, a green composite laminate comprising shrinkage suppression layers and a green multilayer mother substrate provided therebetween is disclosed in Japanese Unexamined Patent Application Publication No. 2000-176928. In this publication, a process is described in which cut-in grooves are provided in the green composite laminate at the two major surfaces sides, the shrinkage suppression layers are further formed so as to cover the cut-in grooves, the laminate thus formed is fired, the shrinkage suppression layers are then removed so as to obtain the sintered multilayer mother substrate, and this multilayer mother substrate is then divided along the cut-in grooves.

However, since the step of forming the cut-in grooves 6, which is different from the previously described in the Unexamined Patent Application Publication step, must be performed in the course of laminating steps for forming the green composite laminate 4 according to the method disclosed in U.S. Pat. No. 2,856,045, the laminating steps and the cut-in groove forming step cannot be efficiently performed, and as a result, the productivity of the multilayer ceramic substrate is decreased.

On the other hand, since the cut-in grooves are formed in the green composite laminate at the two major surface sides according to the method disclosed in Japanese Unexamined Patent Application Publication No. 2000-176928, and the sintered multilayer mother substrate still has the cut-in grooves at the two major surfaces sides, the division of the sintered multilayer mother substrate can be smoothly performed for forming the plurality of multilayer ceramic substrates. However, since the shrinkage suppression layers must be further formed so as to over the cut-in grooves provided in the green composite laminate at the two major surface sides, the process becomes complicated.

In addition, a method for forming external terminal electrodes on side surfaces of the multilayer ceramic substrate has not been described at all in the two publications described above.

Concomitant with the trends towards higher wiring density and miniaturization of multilayer ceramic substrates, it has been strongly desired in recent years that the positions and the dimensions, such as the widths, of the external terminal electrodes be formed with high accuracy. The reason for this is that when the accuracy is degraded and a plurality of external terminal electrodes are provided, short-circuiting may occur between adjacent external terminal electrodes, or electrical connections of a mother board to multilayer ceramic substrates mounted thereon may not be properly obtained in some cases. In particular, when a plurality of external terminal electrodes is plated, and the plating films are abnormally deposited, the problem of short-circuiting between the adjacent external terminal electrodes becomes more serious.

SUMMARY OF THE INVENTION

Accordingly, an object of the present invention is to provide a method for manufacturing multilayer ceramic substrates which can solve the problems described above.

The present invention relates to a method for manufacturing multilayer ceramic substrates in accordance with a multiple formation method using a non-shrinkage process. Briefly speaking, the method is characterized in that a sintered multilayer mother substrate is easily divided by providing through-holes at least in a green multilayer mother substrate forming a green composite laminate, and that when necessary, the positions and the dimensions of external terminal electrodes can be formed with high accuracy by using the inside surfaces of the through-holes.

More particularly, the present invention relates to a method for forming multilayer ceramic substrates each including ceramic layers laminated to each other, and the method comprises the following steps.

A green composite laminate is first formed which comprises a green multilayer mother substrate including ceramic green layers which contain an insulating ceramic powder and which are formed into the ceramic layers by firing, the green multilayer mother substrate being formed to be divided along predetermined dividing lines after the firing so as to obtain the multilayer ceramic substrates; shrinkage suppression layers which contain an inorganic powder and which are disposed so as to sandwich the green multilayer mother substrate in the lamination direction, the inorganic powder not being sintered at the sintering temperature of the insulating ceramic powder; and through-holes provided on the dividing lines so as to penetrate at least the green multilayer mother substrate in the lamination direction.

Next, the green composite laminate described above is fired under the conditions in which the insulating ceramic powder is sintered and the inorganic powder is not sintered. As a result, a sintered multilayer mother substrate between the shrinkage suppression layers is obtained.

Next, the shrinkage suppression layers are removed. As a result, the sintered multilayer mother substrate is obtained.

Subsequently, the fired multilayer mother substrate is divided along the dividing lines. As a result, the multilayer ceramic substrates each have side surfaces including moieties of the inside surfaces of the through-holes.

The step of forming the green composite laminate may comprise a substep of preparing ceramic green sheets for forming the ceramic green layers; a substep of preparing inorganic green sheets for forming the shrinkage suppression layers; a substep of laminating the ceramic green sheets to each other; and a substep of laminating the inorganic green sheets so as to sandwich the ceramic green sheets in the lamination direction.

In the method described above, the step of forming the green composite laminate may further comprise a substep of forming a penetrating portion in a predetermined ceramic green sheet of the ceramic green sheets to form a cavity in each of the multilayer ceramic substrates.

In addition, the step of forming the green composite laminate in order to form the through-holes described above may further comprise a substep of forming the through-holes in the green multilayer mother substrate which is provided between the shrinkage suppression layers.

When the green composite laminate is formed, as described above, and when the substep of laminating the ceramic green sheets and the substep of laminating the inorganic green sheets are used, apertures may be provided in the ceramic green sheets so as to form the through-holes.

In the present invention, the following method is preferably used when the external terminal electrodes are formed using the through-holes.

The step of forming the green composite laminate may further comprises a substep of providing conductors for forming the external terminal electrodes of the multilayer ceramic substrates so that the conductors are exposed at the inside surfaces of the through-holes. Accordingly, the conductors after the step of dividing the sintered multilayer mother substrate to form the multilayer ceramic substrates are exposed at parts of the side surfaces of the multilayer ceramic substrates, the parts of the side surfaces corresponding to parts of the inside surfaces of the through-holes, so as to form the external terminal electrodes.

In the step of forming the green composite laminate described above, the through-holes are preferably provided so as to divide the conductors.

The conductors may be provided so as to penetrate the green multilayer mother substrate in the lamination direction or may be provided so as to extend to a part of the green multilayer structure in the lamination direction.

According to the present invention, wet plating such as electroless plating may be performed for the conductors, which are formed into the external terminal electrodes, before the multilayer mother substrate is divided. That is, after the shrinkage suppression layers are removed and before the multilayer mother substrate is divided, plating films may be deposited on the surfaces of the conductors which are exposed at the inside surfaces of the through-holes when wet plating is performed for the sintered multilayer mother substrate.

In order to form the external terminal electrodes, conductors may be formed on parts of the side surfaces of the multilayer ceramic substrates which are formed in the step of dividing the multilayer mother substrate following the firing step, in which the parts of the side surfaces correspond to parts of the inside surfaces of the through-holes.

The conductors, which are formed into the external terminal electrodes, preferably comprise a conductive paste.

In addition, it is preferable that the conductors be primarily composed of at least one member of the group of Ag, an Ag—Pt alloy, an Ag—Pd alloy, Cu, Au, and Ni.

The through-holes may have an optional cross-section shape in the present invention; however, in order to easily and efficiently divide the multilayer mother substrate, it is preferable that the through-holes have rectangular cross-sectional shapes, and that the longer sides thereof be provided in the directions in which the dividing lines extend.

In order to easily divide the multilayer mother substrate for forming the multilayer ceramic substrates, cut-in grooves may be generally formed along the dividing lines. In the present invention, when the cut-in grooves are formed, the following steps may be performed.

The step of forming the green composite laminate may further comprise a substep of forming the cut-in grooves in the green composite laminate along the dividing lines so as to penetrate at least one of the shrinkage suppression layers and to extend to a part of the green multilayer mother substrate in the thickness direction. In this case, the multilayer mother substrate is divided along the cut-in grooves in the step of dividing the multilayer mother substrate.

When the step of forming the green composite laminate comprises a step of compressing the green composite laminate in the lamination direction, the substep of forming the cut-in groove is preferably performed after the compression step.

In addition, when the through-holes are provided in the step of forming the green composite laminate, the substep of forming the through-holes is preferably performed after the compression step.

Further, the substep of forming the cut-in groove and the substep of forming the through-holes after the compression step are preferably performed in that order, and the step of forming the green composite laminate may comprise a substep of compressing the green composite laminate at a pressure higher than that in the compression step between the substep of forming the cut-in groove and the substep of forming the through-holes.

The cut-in groves may be provided in the fired multilayer mother substrate along the dividing lines, so that the multilayer mother substrate is divided along the cut-in grooves in the step of dividing the multilayer mother substrate.

In addition, the ceramic green layers preferably comprise a glass in the present invention.

DESCRIPTION OF THE PREFERRED EMBODIMENTS

Figure 2:
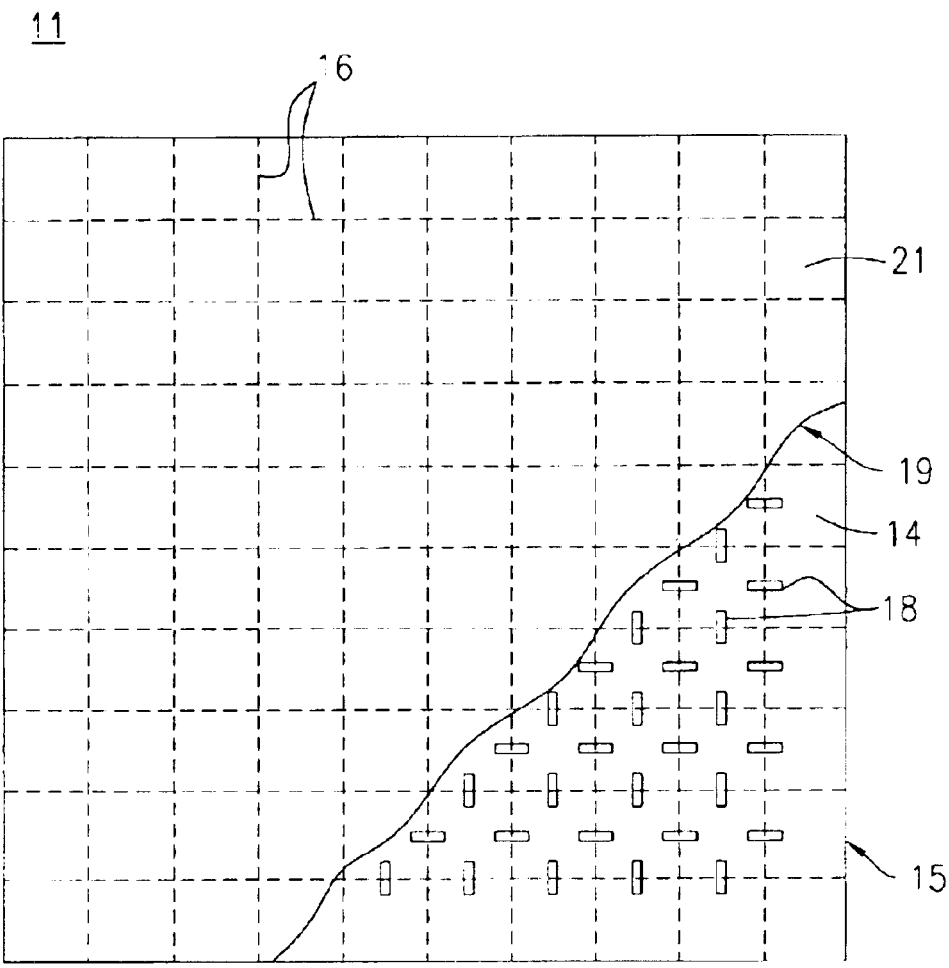
FIG. 2 is a partly cutaway plan view showing a green composite laminate 11 which is formed in a process according to a manufacturing method of a first embodiment of the present invention.
Figure 3:
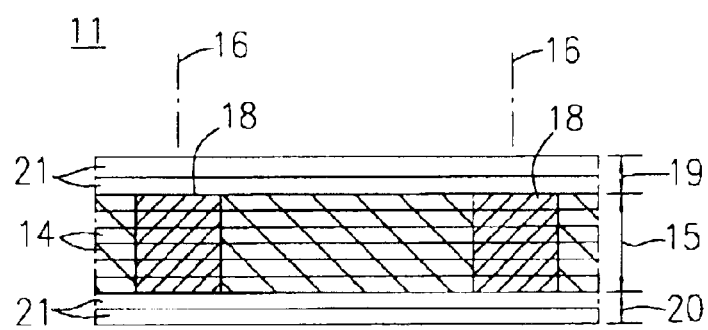
FIG. 3 is an enlarged cross-sectional view of a part of the green composite laminate 11 shown in FIG. 3.
Figure 4:
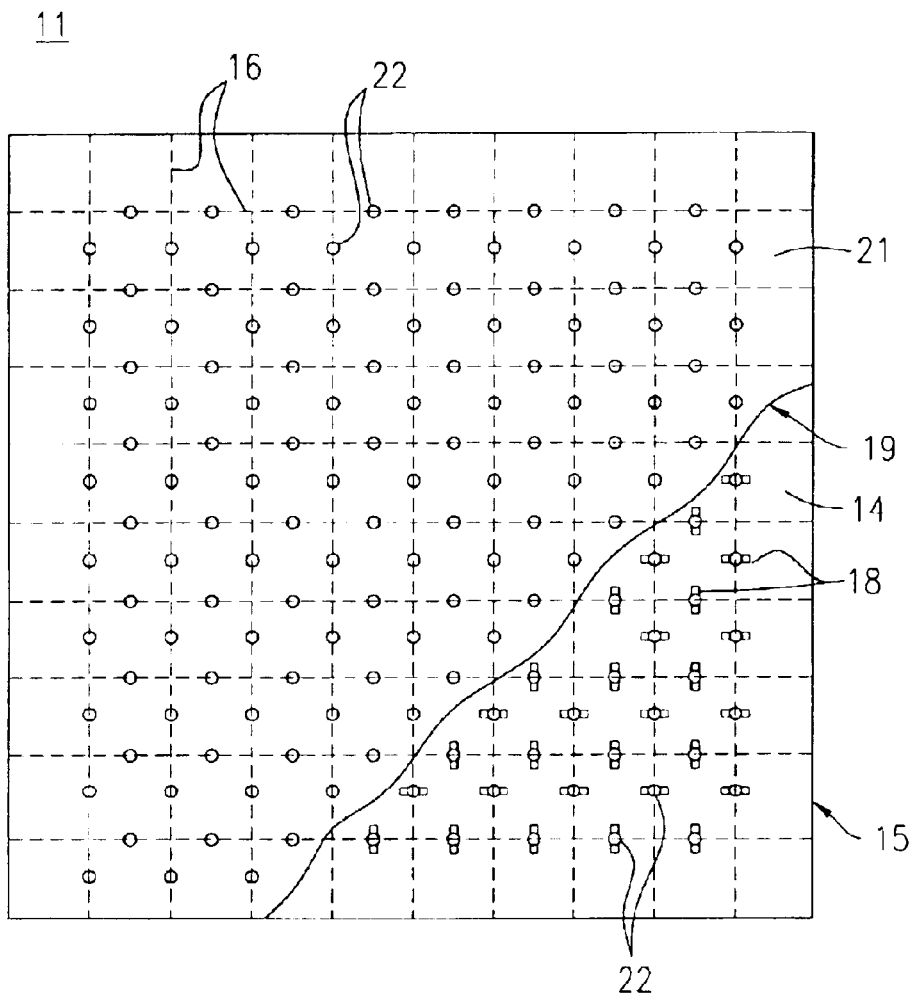
FIG. 4 is a plan view of the green composite laminate 11 shown in FIG. 2 provided with through-holes 22 therein.
Figure 5:
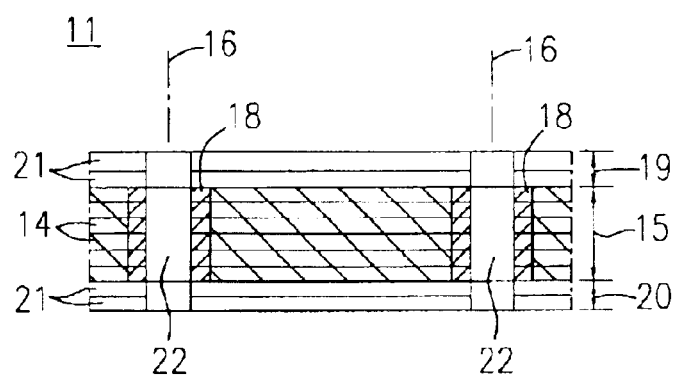
FIG. 5 is an enlarged cross-sectional view of a part of the green composite laminate 11 shown in FIG. 4.
Figure 6:
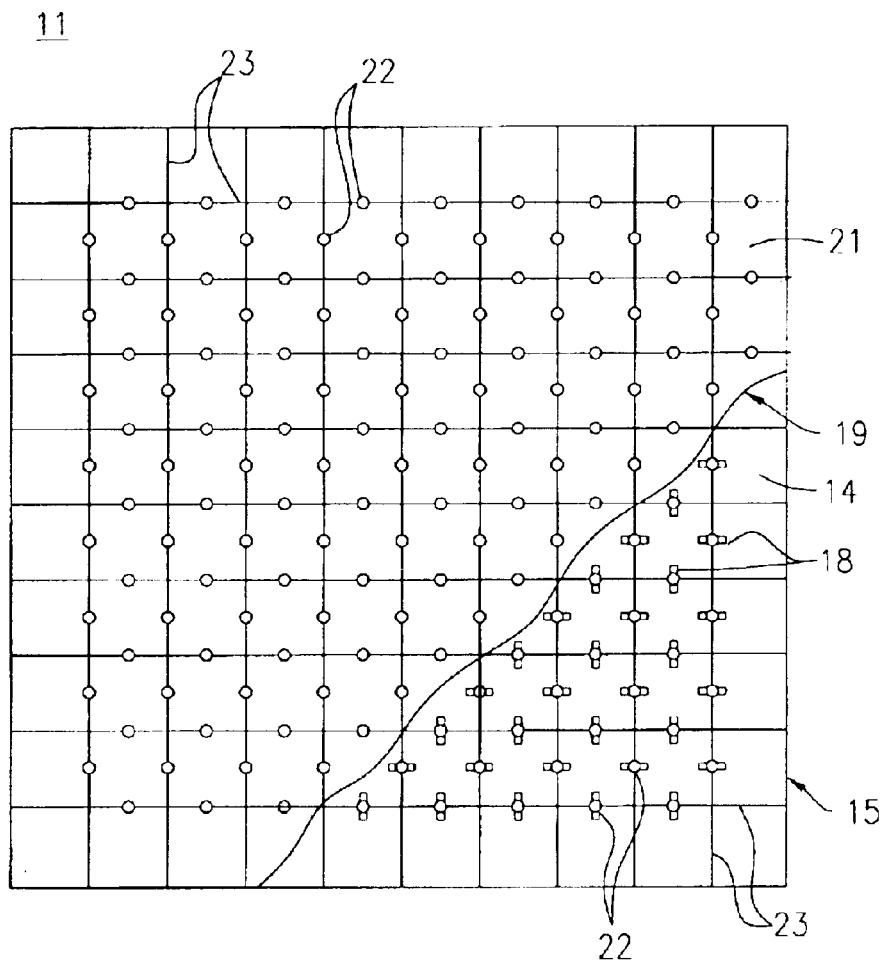
FIG. 6 is a plan view of the green composite laminate 11 shown in FIG. 4 provided with cut-in grooves 23 therein.
Figure 7:
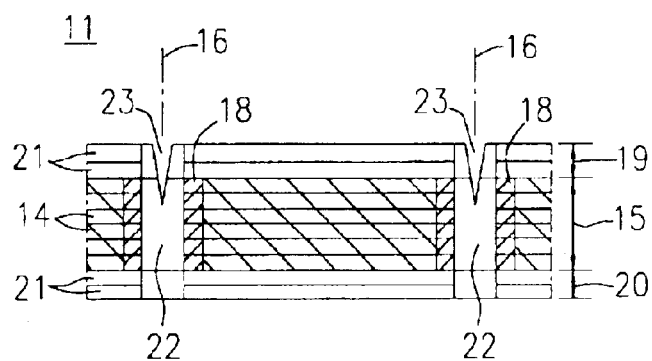
FIG. 7 is an enlarged cross-sectional view of a part of the green composite laminate 11 shown in FIG. 6.
Figure 8:
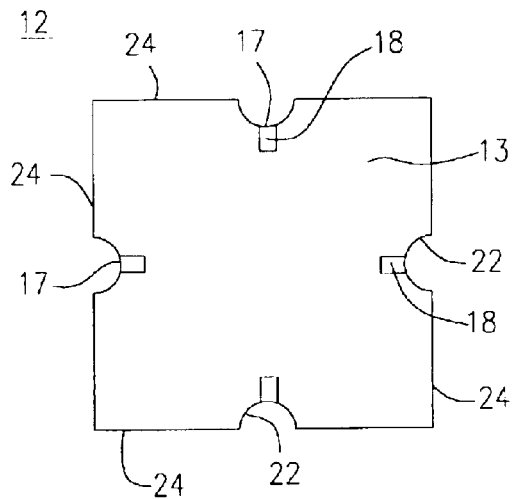
FIG. 8 is an enlarged plan view of a multilayer ceramic substrate 21 obtained from the multilayer mother substrate 15 shown in FIG. 6.

FIGS. 2 to 8 are views for illustrating a first embodiment of the present invention. In these figures, FIGS. 2 to 7 show various steps of a process for manufacturing multilayer ceramic substrates. FIGS. 2, 4, and 6 are plan views showing a composite laminate 11, and FIGS. 3, 5, and 7 are enlarged cross-sectional views of a part of the composite laminate 11. In addition, FIG. 8 is a plan view of a multilayer ceramic substrate 12 obtained through the steps shown in FIGS. 2 to 7.

Figure 1:
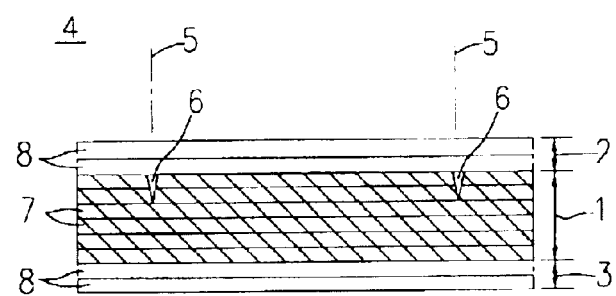
FIG. 1 is an enlarged cross-sectional view of a part of a conventional green composite laminate 4 in relation to the present invention.

In FIGS. 3, 5, and 7, as in the case described with reference to FIG. 1, the dimension in the thickness direction is exaggeratedly shown, and wiring conductors are not shown in the figures except for conductors for forming external terminal electrodes.

As shown in FIG. 8, the multilayer ceramic substrate 12, which is obtained from the composite laminate 11, comprises a plurality of ceramic layers 13 (only the topmost layer is shown in this figure) laminated to each other. As shown in FIGS. 2 to 7, the green composite laminate 11 comprises a green multilayer substrate 15 composed of a plurality of ceramic green layers 14 which contain an insulating ceramic powder and which are formed into the plurality of ceramic layers 13 described above by firing.

The laminated structure composed of the ceramic green layers 14 is formed by, for example, laminating ceramic green sheets, and the ceramic green sheets are obtained by the steps of, for example, adding a binder, a plasticizer, a solvent and the like to an insulating ceramic powder, mixing this mixture using a ball mill or the like to form a slurry, and processing this slurry by a doctor blade method or the like to form sheets.

As the insulating ceramic powder described above, an insulating ceramic powder generally used for forming conventional multilayer ceramic substrates may be used. For example, powdered alumina may be used, and an amorphous glass having a softening point of about 600 to 800° C., a crystallized glass having a crystallization temperature of about 600 to 1,000° C., or the like, may be contained in the powdered alumina. In addition to alumina, zircon, mullite, cordierite, anorthite, or silica may also be used as the insulating ceramic powder.

As the binder, for example, poly(vinyl butyral), methacrylate polymer or acrylic polymer may be used, and as the plasticizer, phthalic acid derivatives or the like may be used. In addition, as the solvent, for example, alcohols, ketones, or chlorinated organic solvents may be used.

After being cut into a predetermined size, the ceramic green sheets are laminated to each other, thereby forming the green multilayer mother substrate 15 comprising the ceramic green layers 14 laminated to each other. The thickness of the ceramic green sheet is not specifically limited; however, in general, a thickness of approximately 25 to 200 μm is preferable. The green multilayer mother substrate 15 is formed to be divided after firing along predetermined dividing lines 16 provided in a lattice pattern so that a plurality of the multilayer ceramic substrates 12 are formed.

Conductors 18 which will be formed into external terminal electrodes 17 (see FIG. 8) of the multilayer ceramic substrate 12 are disposed inside the green multilayer mother substrate 15. In this embodiment, as shown in FIG. 2 in detail, the conductor 18 has a rectangular shape in cross-section and is disposed so as to intersect the dividing line 16. In addition, as shown in FIG. 3 in detail, the conductor 18 is disposed so as to penetrate the green multilayer mother substrate 15 in the lamination direction.

The conductor 18 is preferably formed of a conductive paste. In order to form the conductor 18, the ceramic green sheets for forming the ceramic green layers 14 are provided with apertures therein before being laminated to each other, and subsequently, the apertures are filled with a conductive paste. Alternatively, after the green mother substrate 15 having the laminated structure is formed and apertures penetrating therethrough are formed, these apertures may be filled with a conductive paste.

Even though not shown in the figure, when necessary, conductive films for forming wiring conductors may be formed on the ceramic green sheets, which are not laminated to each other, by screen printing or the like using a conductive paste, apertures may be formed for via hole conductors, and a conductive paste may be filled in the apertures.

It is preferable that the conductor 18, the conductive film for forming the wiring conductor, and the via hole conductor be primarily composed of at least one selected from the group consisting of Ag, an Ag—Pt alloy, an Ag—Pd alloy, Cu, Au and Ni.

In addition, first and the second shrinkage suppression layers 19 and 20 are provided in the green composite laminate 11 so as to sandwich the green multilayer mother substrate 15 in the lamination direction. These shrinkage suppression layers 19 and 20 contain an inorganic powder which is not sintered at a sintering temperature of the insulating ceramic powder contained in the ceramic green sheet 14.

For example, when a powder having a sintering temperature of about 1,100° C. or less is used, as the inorganic powder contained in the shrinkage suppression layers 19 and 20, for example, alumina, zirconium oxide, aluminum nitride, boron nitride, mullite, magnesium oxide, silicon carbide, or the like may be used as the insulating ceramic powder contained in the ceramic green sheet 14. When the particle size of these inorganic powders are too coarse, the surface roughness of the obtained multilayer ceramic substrate also becomes coarse, and hence, the average particle diameter is preferably in the range of approximately about 0.5 to 4 $\mu$m.

The shrinkage suppression layers 19 and 20 are formed by laminating inorganic green sheets 21 containing the inorganic powder. The method for forming the inorganic green sheet 21 is substantially equivalent to that for the ceramic green sheet for forming the ceramic green layer 14. In addition, the thickness of the inorganic green sheet 21 is not specifically limited; however, a thickness of approximately 10 to 200 $\mu$m is preferable. The individual thicknesses of the first and the second shrinkage suppression layers 19 and 20 may be controlled by the number of inorganic green sheets 21 which are laminated to each other.

As described above, the green composite laminate 11 comprising the first and the second shrinkage suppression layers 19 and 20 and the green multilayer mother substrate 15 provided therebetween in the lamination direction is formed, and subsequently, the whole green composite laminate 11 is compressed in the lamination direction. This compression is performed not only for preventing displacement which occurs between the ceramic green layers 14 in subsequent steps but also for improving the adhesion between the ceramic green layers 14 forming the multilayer mother substrate 15, between the inorganic green sheets 21 forming the shrinkage suppression layers 19 and 20, and between the multilayer mother substrate 15 and the shrinkage suppression layers 19 and 20. Accordingly, when the compressing is performed, a relatively high pressure such as 50 MPa or more is applied. In addition, the compressing is preferably performed at a temperature of about 40 to 90° C.

Next, as shown in FIGS. 4 and 5, a plurality of through-holes 22 penetrating at least the green multilayer mother substrate 15 in the lamination direction in the green composite laminate 11 is provided on the dividing lines 16. In addition to the green multilayer mother substrate 15, the shrinkage suppression layers 19 and 20 are also provided with the through-holes 22 penetrating therethrough in this embodiment.

The through-holes 22 have, for example, a circular shape in a cross-section and are formed at positions to penetrate the conductors 18. Accordingly, the conductors 18 are exposed at the inside surfaces of the through-holes 22. In addition, in this embodiment, by forming the through-holes 22, the conductors 18 are divided.

When the through-holes 22 are formed, apertures may be formed beforehand in ceramic green sheets for forming the ceramic green layers 14 so as to form the through-holes 22. In this case, the through-holes 22 are formed to penetrate only the green multilayer mother substrate 15.

In addition, the through-holes 22 may be formed in a green composite laminate 11 which does not comprise one of the shrinkage suppression layers 19 and 20, that is, in the green multilayer mother laminate 15 which is provided with one of the shrinkage suppression layers 19 and 20, and subsequently, the remaining shrinkage suppression layer 19 or 20 may be disposed on the green multilayer mother substrate 15.

Next, as shown in FIGS. 6 and 7, cut-in grooves 23 are provided along the dividing lines 16 of the green laminate 11. These cut-in grooves 23 are disposed in a lattice pattern as shown in FIG. 6 in detail. As a method for forming the cut-in grooves 23, for example, a method for pressing a cutter blade onto a surface of the composite laminate 11 or a method for cutting in the composite laminate 11 by a rotary blade may be used.

The cut-in grooves 23 are formed so as to penetrate the first shrinkage suppression layer 19 and to extend into a part of the green multilayer mother substrate 15 to a certain depth in the lamination direction. This depth is approximately one-tenth to four-tenths of the thickness of the green multilayer mother substrate 15. The cut-in grooves 23 may also be provided at the second shrinkage suppression layer 20 side so as to correspond to the positions of the cut-in grooves 23 at the first shrinkage suppression layer 19 side.

Next, the green composite laminate 11 provided with the through-holes 22 and the cut-in grooves 23 is processed in a firing step. This firing step is performed under the conditions in which only the insulating ceramic powder contained in the ceramic green layers 14 are sintered and the inorganic powder contained in the shrinkage suppression layers 19 and 20 is not sintered. When the composite laminate 11 is placed on a tray while being fired, a tray made of a general alumina plate may be used. In addition, a tray made of an alumina plate having a high porosity and superior permeability may also be used.

Since the inorganic powder contained in the shrinkage suppression layers 19 and 20 is not substantially sintered in the firing step, the shrinkage suppression layers 19 and 20 do not substantially shrink. Accordingly, the shrinkage suppression layers 19 and 20 restrict the green multilayer mother substrate 15, and as a result, the green multilayer mother substrate 15 substantially shrinks only in the thickness direction and is restricted from being shrunk in the direction parallel to the main surface. Consequently, nonuniform deformation of the multilayer mother substrate 15 after firing is unlikely to occur.

After the fired multilayer mother substrate 15 provided between the first and the second shrinkage suppression layers 19 and 20 is obtained, the shrinkage suppression layers 19 and 20 are removed by using a brush or the like, and as a result, the fired multilayer mother substrate 15 is obtained.

Next, wet plating such as electroless plating is performed for the fired multilayer mother substrate 15, that is, a step of depositing plating films on exposed surfaces of the conductors 18 provided in the through-holes 22 is performed. More particularly, nickel plating films or the like are formed on the surfaces of the conductors 18 by electroless plating, and on the films thus formed, gold plating films are formed.

Subsequently, the fired multilayer mother substrate 15 is divided along the cut-in grooves 23, and as a result, the desired multilayer ceramic substrates 12 as shown in FIG. 8 can be obtained.

At side surfaces 24 of the multilayer ceramic substrate 12, which correspond to parts of the inside surfaces of the through-holes 22, the conductors 18 are exposed to the outside so as to form external terminal electrodes 17.

The present invention has been described heretofore with reference to the first embodiment; however, without departing from the spirit and the scope of the present invention, various modifications may be performed.

For example, the cut-in groove 23 has a V-shaped cross-section in the first embodiment; however, another shape such as a U-shape cross-section may also be used, and in addition, as long as the fired composite laminate 11 does not easily crack when handled, a cut-in groove having any other shape may also be used.

In addition, the composite laminate 11 has substantially a square shape in plan view; however, a rectangular shape in plan view, in which the sides intersecting each other have lengths different from each other, may also be used.

Inside the green multilayer mother substrate 15, the conductors 18 which are formed into the external terminal electrodes 17 are provided beforehand in the first embodiment; however, in place of this, conductors such as a conductive paste may be provided on the side surfaces 24 of the multilayer ceramic substrates 12 obtained by dividing the fired multilayer mother substrate 15, the side surfaces 24 corresponding to parts of the inside surfaces of the through-holes 22. After a conductive paste is applied, a step of firing the conductive paste and any necessary plating step are performed.

In addition, after the green composite laminate 11 is compressed in the lamination direction, the through-holes 22 are formed, and the cut-in grooves 23 are then provided in the first embodiment; however, a step of forming the through-holes 22 and a step of providing the cut-in grooves 23 may be performed in the opposite order. When the steps are performed in the opposite order, before the step of providing the cut-in grooves 23, a pre-compression step is performed at a pressure such as 100 MPa or less, and after the cut-in grooves 23 are provided and before the through-holes 22 are formed, a post-compression step is preferably performed at a higher pressure than that of the pre-compression step, that is, at a pressure such as 50 MPa or more.

The cut-in grooves 23 in the first embodiment are provided in the green composite laminate 11 before firing; however, the cut-in grooves may be provided in the fired multilayer mother substrate 15, and the multilayer mother substrate 15 may be divided along these cut-in grooves. In the case described above, the cut-in grooves are generally provided in the multilayer mother substrate 15 which is obtained after the shrinkage suppression layers 19 and 20 are removed; however, the cut-in grooves may be provided in the composite laminate 11 after firming and before the shrinkage suppression layers 19 and 20 are removed.

When the green composite laminate 11 is formed in the first embodiment, the ceramic green sheets for forming the ceramic green layers 14 and the inorganic green sheets 21 for forming the shrinkage suppression layers 19 and 20 are first prepared, and the step of laminating these green sheets to each other is performed; however, without preparing the ceramic green sheets and the inorganic green sheets 21, a ceramic slurry for forming the ceramic green layers 14 and an inorganic slurry for forming the shrinkage suppression layers 19 and 20 may be repeatedly applied by printing or the like to form a laminated structure.

The through-holes 22 in the first embodiment are formed so as to divide the conductors 18; however, the conductors 18 do not always necessarily have to be divided by the through-holes 22. For example, the through-holes 22 may be provided at positions which deviate from the center of the conductor 18 in some cases, so that parts of conductors 18 are exposed at the inside surfaces of the through-holes 22.

In the first embodiment, the cross-section of the conductor 18 is rectangular, and the cross-section of the through-hole 22 is circular; however, the cross-sections may be variously changed. In addition, the positions and the numbers of the conductors 18 and the through-holes 22 may also be variously changed in accordance with the designs of the multilayer ceramic substrates.

Referring to FIGS. 9 to 12, variations mentioned above will be particularly described. FIGS. 9 to 12 correspond to FIG. 6 of the first embodiment, the same reference numerals of the constituent elements shown in FIG. 6 designate the same constituent elements in these figures, and the descriptions thereof are omitted.

Figure 9:
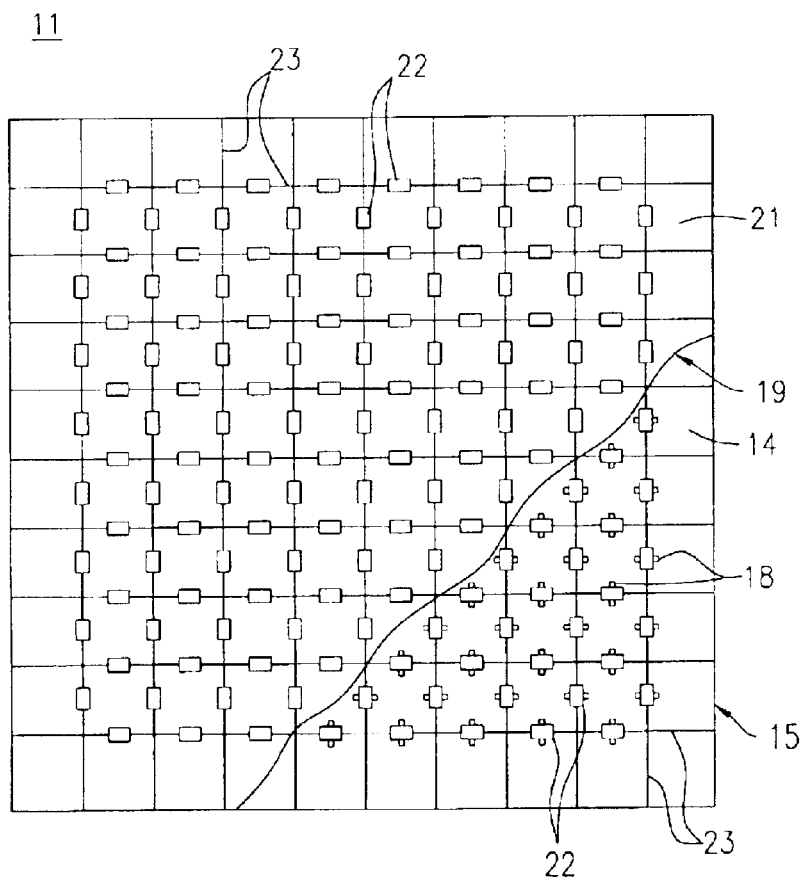
FIG. 9 is a view for illustrating a second embodiment of the present invention, the view corresponding to FIG. 6.

In a second embodiment shown in FIG. 9, as is the conductors 18 shown in FIG. 2, conductors 18 having a rectangular cross-section are formed, and through-holes 22 having a rectangular cross-section are provided so as to divide the conductors 18.

Figure 10:
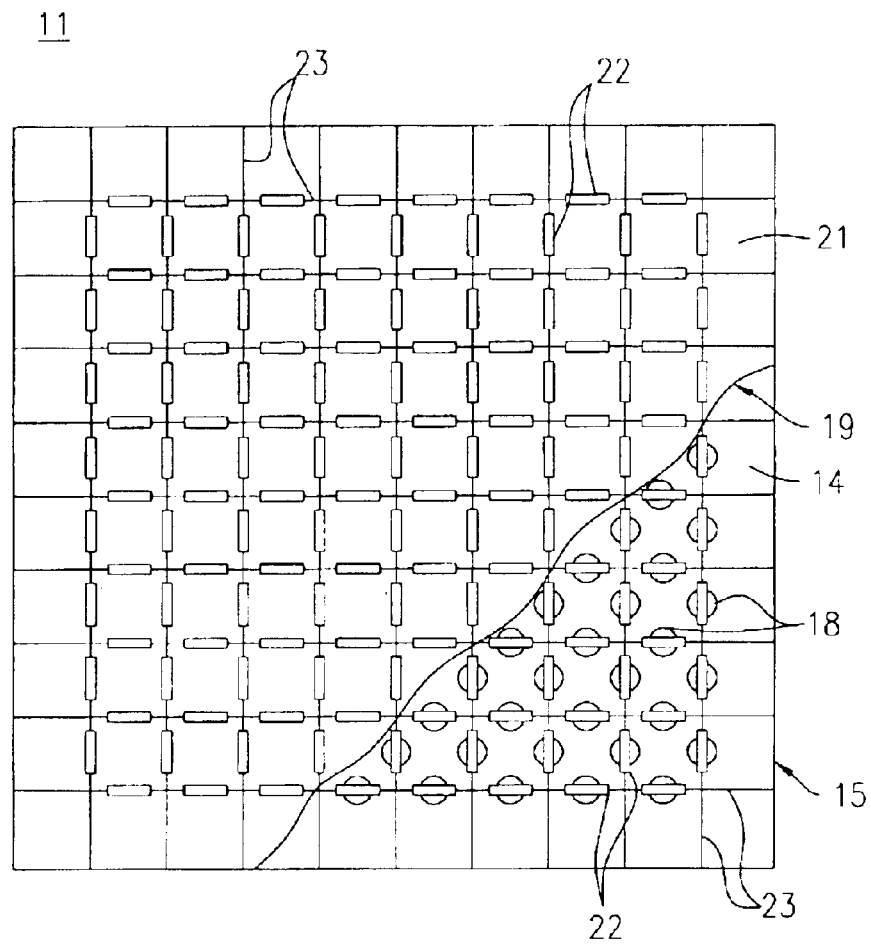
FIG. 10 is a view for illustrating a third embodiment of the present invention, the view corresponding to FIG. 6.

In a third embodiment shown in FIG. 10, conductors 18 having a circular cross-section are formed, and through-holes 22 having a rectangular cross-section are provided so as to divide the conductors 18. In particular, the through-holes 22 shown in FIG. 10 has longer sides in a cross-section, and the longer sides are aligned along the dividing lines 16, that is, in the directions in which the cut-in grooves 23 extend. Accordingly, the division along the cut-in grooves 23 can be smoothly performed.

Figure 11:
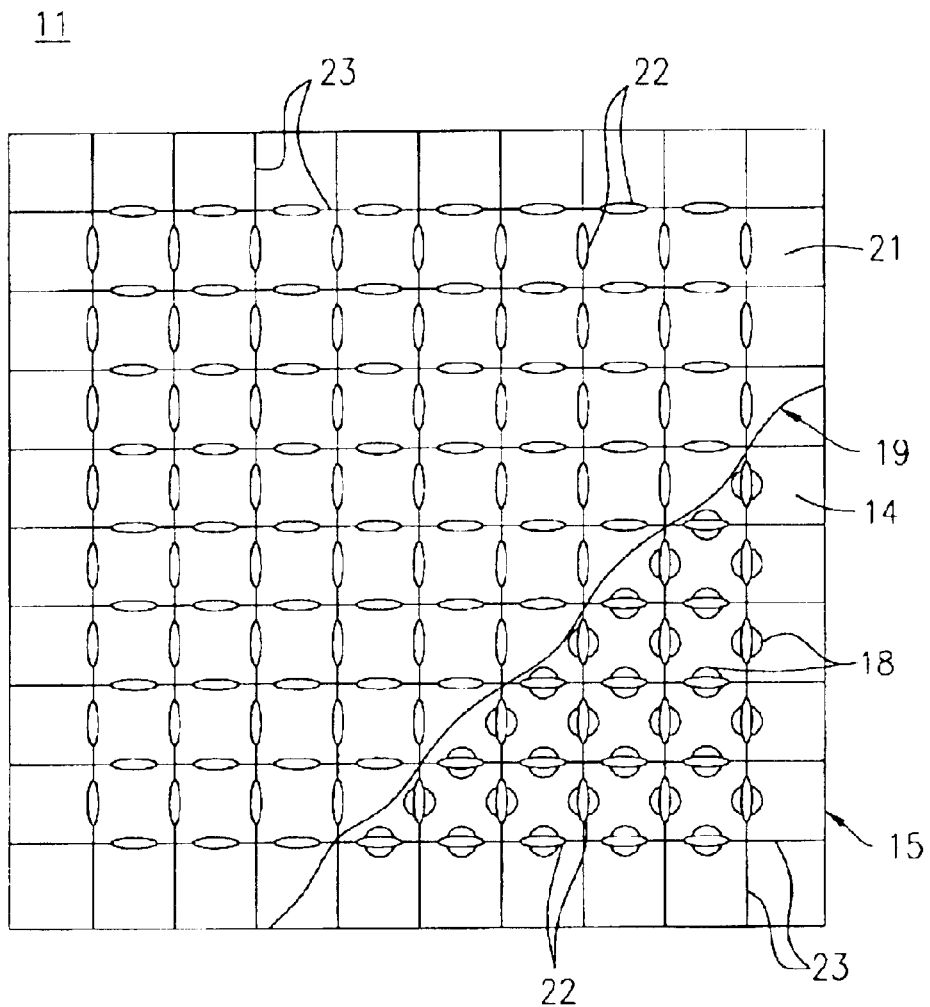
FIG. 11 is a view for illustrating a fourth embodiment of the present invention, the view corresponding to FIG. 6.

In a fourth embodiment shown in FIG. 11, conductors 18 having a circular cross-section are formed, and through-holes 22 having an oval or ellipse cross-section are provided so as to divide the conductors 18. In this embodiment, the through-holes 22 has longer sides in a cross-section, and the longer sides are aligned along the dividing lines 16, that is, in the direction in which the cut-in groove 23 extend.

Figure 12:
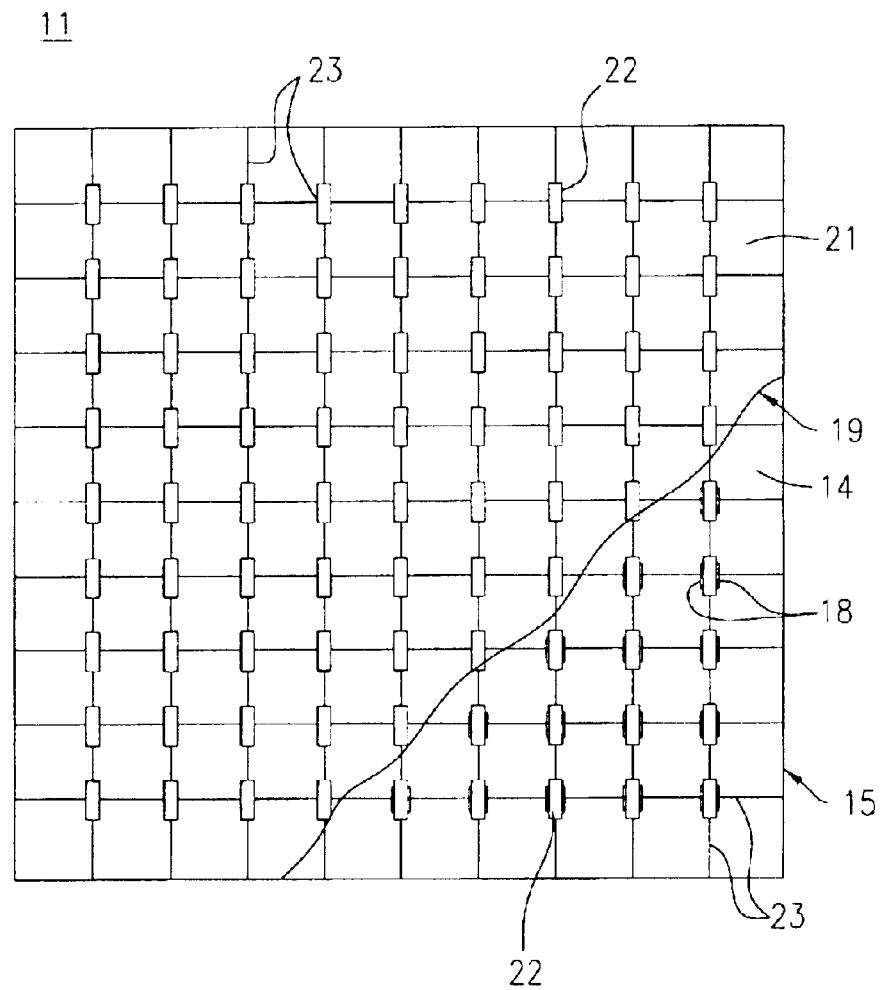
FIG. 12 is a view for illustrating a fifth embodiment of the present invention, the view corresponding to FIG. 6.

In a fifth embodiment shown in FIG. 12, conductors 18 having substantially a square cross-section are formed, and through-holes 22 having a rectangular cross-section are provided so as to divide the conductors 18. In addition, the conductors 18 and the through-holes 22 in this embodiment are formed at intersections of dividing lines 16, that is, at intersections between cut-in grooves 23, extending in the longitudinal direction and in the lateral direction. Accordingly, when the multilayer ceramic substrates are obtained by dividing the fired multilayer mother substrate 15, external terminal electrodes are formed at four corners of each multilayer ceramic substrate.

Even though not shown in the figures, various types of conductor 18 having cross-sections different from each other and/or various types of through-holes 22 having cross-sections different from each other may be formed in one composite laminate or one multilayer mother substrate.

Figure 13:
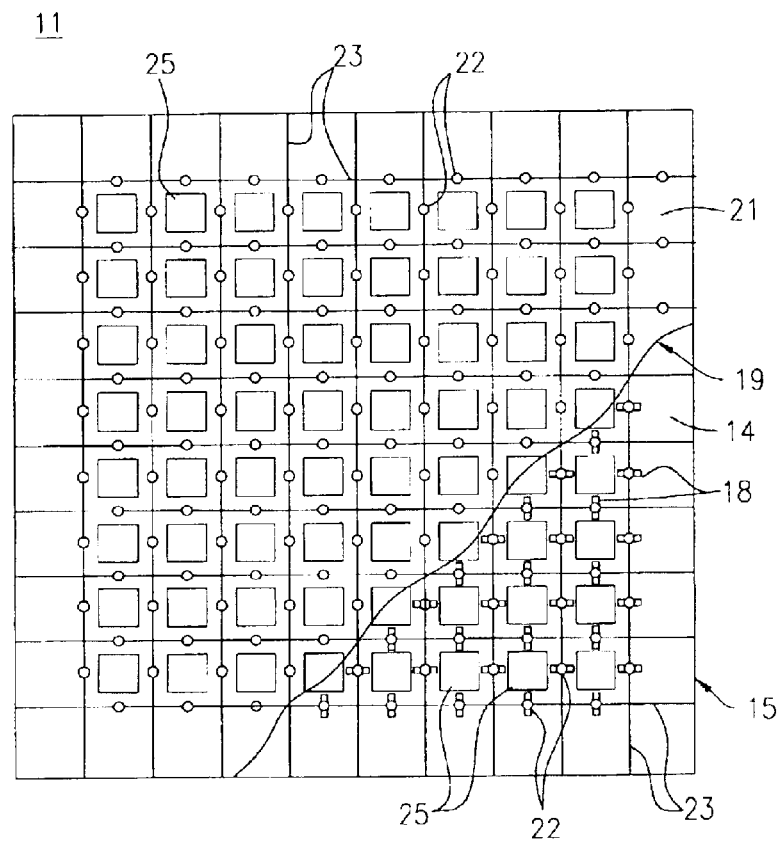
FIG. 13 is a view for illustrating a sixth embodiment of the present invention, the view corresponding to FIG. 6.
Figure 14:
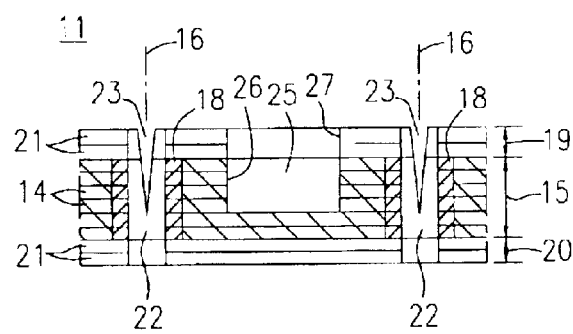
FIG. 14 is an enlarged cross-sectional view of a part of the green composite laminate 11 shown in FIG. 13.

FIGS. 13 and 14 are views for illustrating a sixth embodiment of the present invention and correspond to FIGS. 6 and 7 in the first embodiment, respectively. The same reference numerals of the constituent elements in FIGS. 6 and 7 designate the same constituent elements in FIGS. 13 and 14, and descriptions thereof are omitted.

This sixth embodiment is characterized in that multilayer ceramic substrates each having a cavity 25 are formed. In order to form the cavity 25, a penetrating portion 26 for forming the cavity are formed in predetermined ceramic green sheets selected from the ceramic green sheets for forming the ceramic green layers 14 which constitute the green multilayer mother substrate 15.

In addition, the first shrinkage suppression layer 19 provided at an opening side of the cavity 25 is preferably provided with a penetrating portion 27 which communicate with the cavity 25. The reason for this is that in a compression step, compression can be easily performed for the bottom portion of the cavity 25.

When the cavity 25 is formed, the fired multilayer mother substrate 15 may easily and undesirably crack at the cavity 25 portions in some cases. Accordingly, relatively deep cut-in grooves 23 for dividing the multilayer mother substrate 15 are preferably formed so as to form the multilayer ceramic substrates. The depth of the cut-in groove 23 may be approximately seven-tenths of the thickness of the multilayer mother substrate 15 in some cases.

Figure 15:
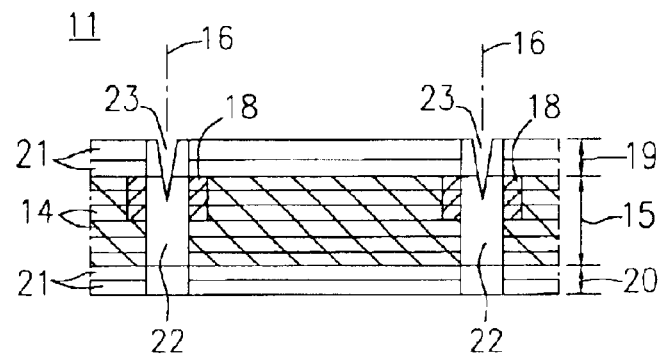
FIG. 15 is a view for illustrating a seventh embodiment of the present invention, the view corresponding to FIG. 7.

FIG. 15 corresponds to FIG. 7 and is a view for illustrating a seventh embodiment of the present invention. The same reference numerals of the constituent elements in FIG. 7 designate the same constituent elements in FIG. 15, and descriptions thereof are omitted.

In the first embodiment described with reference to FIG. 7 and so on, the conductors 18 are disposed so as to penetrate the green mother substrate 15 in the lamination direction; however, in the seventh embodiment, conductors 18 are each disposed to extend only to a part of the green multilayer mother substrate 15 in the lamination direction. When multilayer ceramic substrates in this embodiment are mounted on a motherboard, in addition to a decrease of solder amount, the heights of solder fillets which will be formed can be decreased and can be easily made constant. Accordingly, when this multilayer ceramic substrate is used in high-frequency applications, variation in inductance component caused by solder fillets can be decreased.

Figure 16:
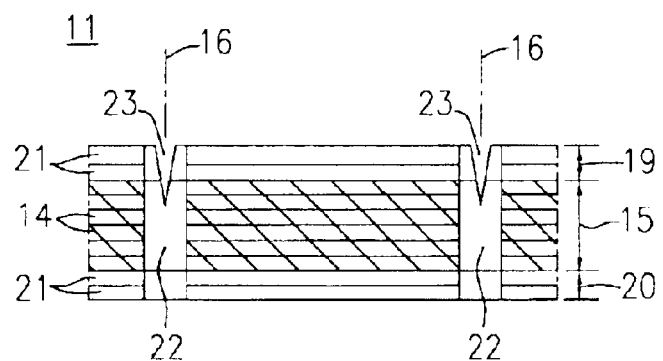
FIG. 16 is a view for illustrating an eighth embodiment of the present invention, the view corresponding to FIG. 7.

FIG. 16 corresponds to FIG. 7 and is a view for illustrating an eighth embodiment of the present invention. The same reference numerals of the constituent elements in FIG. 7 designate the same constituent elements in FIG. 16, and descriptions thereof are omitted.

In this eighth embodiment, conductors for forming the external terminal electrodes are not provided in the through-holes 22. Even when the conductors are not provided, the presence of the through-holes 22 may at least fulfill the effect of smoothly dividing the sintered multilayer mother substrate 15 along the dividing lines 16.

In this embodiment, when the external terminal electrodes are necessary, a conductive paste or the like may be applied to side surfaces of multilayer ceramic substrates obtained by dividing the sintered multilayer mother substrate 15, the side surfaces corresponding to part of the inside surfaces of the through-holes 22, so as to form conductors for forming the external terminal electrodes.

The through-holes 22 shown in FIG. 16 that are not provided with conductors may be formed together with the through-holes 22 provided with the conductors 18 described in the above embodiments. In the case described above, the through-holes 22 having the configuration shown in FIG. 15 are formed only to obtain a superior dividing property, and an appropriate number thereof may be disposed along the dividing lines 16.

Next, examples performed in order to verify the effect of the present invention will be described.

EXAMPLE

Powdered alumina and powdered crystallized glass composed of powdered $SiO_2$, $Al_2O_3$, $B_2O_3$ and CaO were mixed in an equivolume ratio. Next, 15 parts by weight of poly (vinyl butyral), 40 parts by weight of isopropyl alcohol and 20 parts by weight of toluene were added to 100 parts by weight of the mixed powder, and the mixture thus formed was mixed using a ball mill for 24 hours, thereby forming a slurry. Next, this slurry was processed by a doctor blade method, thereby forming ceramic green sheets 120 μm thick.

In addition, 15 parts by weight of poly(vinyl butyral), 40 parts by weight of isopropyl alcohol and 20 parts by weight of toluene were added to 100 parts by weight of powdered alumina, and were then mixed using a ball mill for 24 hours, thereby forming a second slurry. This slurry was processed by a doctor blade method, thereby forming inorganic green sheets 120 μm thick.

Subsequently, six pieces of the ceramic green sheets described above were laminated to each other, and on each of the top and the bottom surfaces of the laminate thus formed, two pieces of the inorganic green sheets were provided and laminated together, thereby forming a green composite laminate 11 having the structure, shown in FIGS. 2 and 3, in which a green multilayer mother substrate 15 was provided between a first and a second shrinkage suppression layers 19 and 20. This green multilayer mother substrate 15 was cut so that the planar dimensions were 135 mm by 135 mm.

In the green multilayer mother substrate 15 forming this green composite laminate 11, conductors 18 which were formed into external terminal electrodes 17 (see FIG. 8) were provided, and ceramic green sheets provided with the conductors 18 formed of a conductive paste were used as the ceramic green sheets.

Next, the green composite laminate 11 was placed in a mold, and compression at a pressure of 100 MPa was performed at 60° C.

Next, as shown in FIGS. 4 and 5, through-holes 22 were formed on dividing lines 16 by punching. Conductors 18 were divided by these through-holes 22 and the conductors 18 were exposed at the inside surfaces of the through-holes 22.

As shown in FIGS. 6 and 7, by pressing a cutter blade onto one major surface of the green composite laminate 11, cut-in grooves 23 having a V cross-section and a depth of 350 μm were formed in a lattice pattern over one entire major surface. The pitches between the cut-in grooves adjacent to each other were set to 10 mm.

After being placed on a 70%-porosity alumina tray having a flatness of 0.05% or less in warpage per unit length in the direction along the side, the green composite laminate 11 was heated to 600° C. for 3 hours and was then further heated to 900° C. for 1 hour, so that only the multilayer mother substrate 15 of the composite laminate 11 was sintered.

Next, the shrinkage suppression layers 19 and 20, which were formed on both sides of the sintered multilayer mother substrate 15, were removed by polishing using a brush, thereby obtaining the multilayer mother substrate 15 having cut-in grooves 23 in the surface portion thereof.

Next, electroless nickel plating and electroless gold plating were performed for the multilayer mother substrate 15. Consequently, nickel plating films and gold plating films were preferably deposited on the surfaces of the conductors 18 which were exposed at the inside surfaces of the through-holes 22.

When the maximum warpage per unit length in a predetermined direction of this multilayer mother substrate was measured, the warpage was merely 0.10%.

Next, the multilayer mother substrate 15 was divided along the dividing lines 16 in accordance with the chocolate break method, thereby obtaining the multilayer ceramic substrates 12 as shown in FIG. 8. In this dividing step, no cracking and chipping occurred in the multilayer ceramic substrates 12 thus obtained.

Comparative Example 1

Ceramic green sheets and inorganic green sheets were formed in a manner similar to that in the above example.

Figure 17:
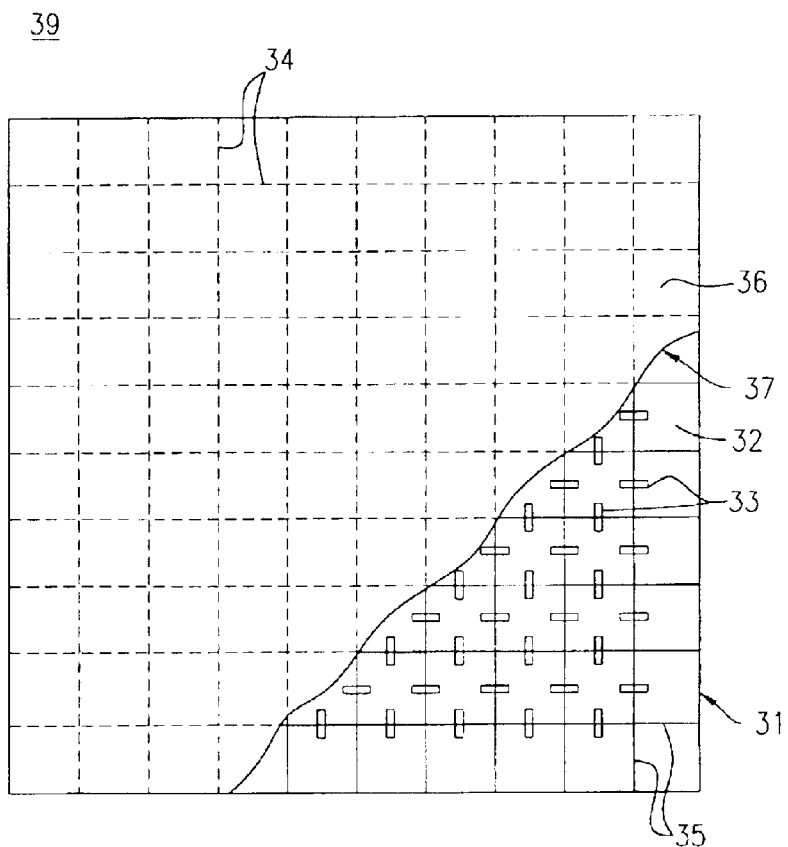
FIG. 17 is a partly cutaway plan view of a green composite laminate 39 formed in comparative example 1.
Figure 18:
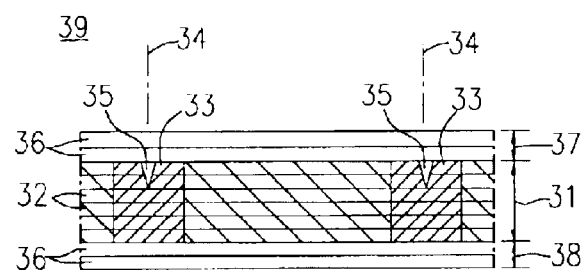
FIG. 18 is an enlarged cross-sectional view of a part of the green composite laminate 39 shown in FIG. 17.

Next, after six pieces of the ceramic green sheets were laminated to each other to form a green mother substrate 31, the green mother substrate 31 was placed in a mold and was processed by a pre-compression step at a pressure of 50 MPa and at a temperature of 60° C. This green multilayer mother substrate 31 is shown in FIGS. 17 and 18. As in the case of the multilayer mother substrate 15 described in the Example, the green multilayer mother substrate 31 comprises ceramic green layers 32 and conductors 33 for forming external terminal electrodes.

A cutter blade was pressed onto one major surface of the green multilayer mother substrate 31 to form cut-in grooves 35 having a V-shaped cross-section to depth of 350 $\mu$m along dividing lines 34 in a lattice pattern over the entire major surface. The pitche between the cut-in grooves 35 adjacent to each other were set to 10 mm.

Next, the green multilayer mother substrate 31 provided with the cut-in grooves 35 was cut so that the planar dimensions were 135 mm by 135 mm, and on each of the top and the bottom sides of this green multilayer mother substrate 31, two pieces of the inorganic green sheets 36 having planar dimensions of 135 mm by 135 mm were provided and were laminated together, thereby forming a green composite laminate 39 having the structure in which the green multilayer mother substrate 31 was provided between a first and a second shrinkage suppression layer 37 and 38. Subsequently, this green composite laminate 39 was again placed in a mold and was compressed at a pressure of 100 MPa and at a temperature of 60° C.

Next, a firing step was performed under the conditions equivalent to those in the Example, and the shrinkage suppression layers 37 and 38 were removed in a manner similar to that in the Example, thereby obtaining a fired multilayer mother substrate 31 provided with the cut-in grooves 35 in the surface portion thereof.

When the maximum warpage per unit length in a predetermined direction of this multilayer mother substrate 31 was measured, the warpage was 0.10%, which was approximately equal to that obtained in the Example.

Next the multilayer mother substrate 31 was divided along the cut-in grooves 35. Cracking and chipping occurred in the obtained multilayer ceramic substrate, or defects occurred in that, for example, since the division was not smoothly performed at positions where the conductors 33 were formed, some conductor 33 was not divided and was only provided on one of side surfaces formed by this division.

For this multilayer mother substrate 31, electroless plating could not be performed to deposit plating films on the surfaces of the conductors 33.

The process performed in this Comparative Example 1 corresponds to the process described in U.S. Pat. No. 2,856,045 described above.

Comparative Example 2

Ceramic green sheets and inorganic green sheets were formed in a manner similar to that in the above Example.

Figure 19:
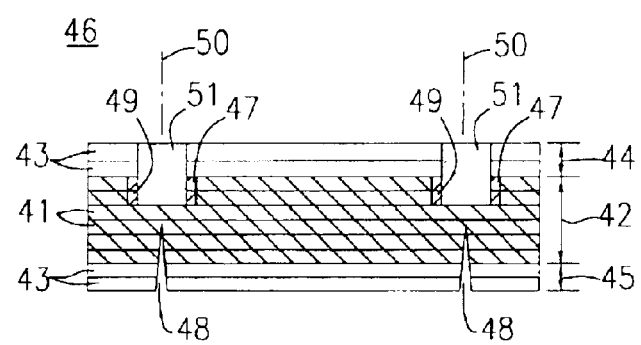
FIG. 19 is an enlarged cross-sectional view of a part of a green composite laminate 46 formed in comparative example 2.

Next, as shown in FIG. 19, by laminating six ceramic green sheets to each other, a green multilayer mother substrate 42 comprising laminated ceramic green layers 41 was formed, and by laminating two inorganic green sheets 43 on each of the top and the bottom of the multi layer mother substrate 42, a green composite laminate 46 having the structure in which the green multilayer mother substrate 42 was provided between a first and a second shrinkage suppression layer 44 and 45 was formed.

Conductors 47 were formed by filling a conductive paste in the multilayer mother substrate 42 of the green composite laminate 46 as shown in FIG. 19.

Next, the green composite laminate 46 was placed in a mold and was compressed at a pressure of 100 MPa and at a temperature of 60° C.

A cutter blade was pressed onto one major surface of the green multilayer mother substrate 46 at the second shrinkage suppression layer 45 side to form cut-in grooves 48 having a V-shaped cross-section and a depth of 350 $\mu$m in a lattice pattern over the entire major surface. The pitch between the cut-in grooves 48 adjacent to each other were set to 10 mm.

In addition, slit-shaped cut-in grooves 49 having a depth of 350 $\mu$m and a width of 300 $\mu$m were formed in the major surface portion of the green multilayer composite laminate 46 at the first shrinkage suppression layer 44 side.

These cut-in grooves 48 and 49 were provided on dividing lines 50.

Next, an inorganic paste 51 containing an inorganic powder, which had the same composition as that of the shrinkage suppression layers 44 and 45, was filled in the slit-shaped cut-in grooves 49.

Next, a firing step was performed under the conditions equivalent to those in the Example, and the shrinkage suppression layers 44 and 45 were removed in a manner similar to that in the Example, thereby obtaining a fired multilayer mother substrate 42 provided with the cut-in grooves 48 and 49 in the surface portion thereof.

When the maximum warpage per unit length in a predetermined direction of this multilayer mother substrate 42 was measured, the warpage was 0.10% which is approximately equal to that obtained in the Example.

When the multilayer mother substrate 42 was divided along the dividing lines 50 at which the cut-in grooves 48 and 49 were provided, a superior dividing property could be obtained.

However, the cut-in grooves 49 did not penetrate in the second comparative example, and since smooth flow of a plating solution could not be expected, electroless plating could not be preferably performed on this multilayer mother substrate 42 for depositing plating films on surfaces of the conductors 47.

The process performed in this Second Comparative Example is similar to that described in Japanese Unexamined Patent Application Publication No. 2000-176928 described above.

As has thus been described, when the green composite laminate having the shrinkage suppression layers and the green multilayer mother substrate provided therebetween is formed according to the present invention, undesired deformation or strains are unlikely to occur in the fired multilayer mother substrate, and in addition, the division thereof can be smoothly performed along the dividing lines since the through-holes are formed on the dividing lines which are used for obtaining the multilayer ceramic substrates from the multilayer composite laminate so as to penetrate at least the green multilayer mother substrate.

Accordingly, the production efficiency of the multilayer ceramic substrate can be improved since a multilayer mother substrate having a larger area can be formed, and in addition, cracking and chipping are unlikely to occur in the multilayer ceramic substrate in a dividing step, whereby the production yield of the multilayer ceramic substrate can be improved.

In addition, parts of the side surfaces of the multilayer ceramic substrate obtained by the division correspond to parts of the inside surfaces of the through-holes. These parts of the inside surfaces of the through-holes forming the parts of the side surfaces of the multilayer ceramic substrate can be advantageously used for forming the external terminal electrodes. Since such external terminal electrodes described above are provided in recesses which are formed by dividing the through-holes, the positions and the widths of the external terminal electrodes can be formed with high accuracy, and hence, miniaturization of the multilayer ceramic substrate and higher wiring density can be advantageously realized. In addition, even when abnormal deposition of plating films occurs, electrical short-circuiting between the external terminal electrodes adjacent to each other becomes unlikely to occur when plating is performed on the external terminal electrodes.

When the cavity is formed in the multilayer ceramic substrate, as described above, the effect of obtaining a superior dividing property described above becomes significantly important since cracking is likely to occur at the cavity portion.

When the through-holes, which are one of the features of the present invention, are provided to penetrate the green composite laminate which are formed of the shrinkage suppression layers and the green multilayer mother substrate provided therebetween, the through-holes can be efficiently formed.

According to the present invention, the green multilayer mother substrate comprises the conductors, which are formed into the external terminal electrodes of the multilayer ceramic substrates, and the conductors are exposed at the inside surfaces of the through-holes when they are formed. In addition, after the fired multilayer mother substrate is divided to form the multilayer ceramic substrates, the conductors formed into the external terminal electrodes can be provided in the recesses so as to fulfill the effect described above since the conductors provided on the inside surfaces of the through-holes are divided to form the external terminal electrodes on the side surfaces of the multilayer ceramic substrates and to be exposed to the outside. That is, in addition to the superior dividing property, the through-holes are formed to realize the external terminal electrodes, and hence, through-holes having multifunctionality can be realized. Furthermore, the formation of the external terminal electrodes can be efficiently performed.

Accordingly, when the conductor is formed to extend only to a part of the green multilayer mother substrate in the lamination direction, the amount of solder used for mounting the obtained multilayer ceramic substrates on a motherboard can be decreased, the heights of solder fillets can be determined in accordance with the dimension of the conductor in the lamination direction, and when the multilayer ceramic substrate is used for high-frequency applications, variation in inductance components caused by the solder fillets can be decreased.

When the conductors which are formed into the external terminal electrodes are provided so as to be exposed at the inside surfaces of the through-holes, wet plating such as electroless plating may be performed for the multilayer mother substrate to deposit plating films on the surfaces of the conductors, and hence, the step of forming plating films on the external terminal electrodes can be efficiently performed.

In the present invention, when the green composite laminate is formed, and when the cut-in grooves are provided along the dividing lines so as to penetrate at least one shrinkage suppression layer and to extend to a part of the green multilayer mother substrate in the thickness direction, a more superior dividing property can be obtained in the step of dividing the fired multilayer mother substrate for obtaining the multilayer ceramic substrates.

When the cut-in grooves described above are formed, the laminating process and the step of forming the cut-in grooves can be efficiently performed since the step of forming the cut-in grooves is not necessarily performed in the lamination process for forming the green composite laminate.

When the step of forming the cut-in grooves and the step of forming the through-holes are performed after compressing the green composite laminate in the lamination direction, the adhesion between the ceramic green layers forming the green multilayer mother substrate and between the multilayer mother substrate and the shrinkage suppression layers are improved, and the cut-in grooves and the through-holes are then formed under these conditions, whereby the cut-in grooves and the through-holes in a proper state can be reliably provided.

In addition, when the ceramic green layers forming the green multilayer mother substrate contain a glass or a crystallized glass in the present invention, sintering of the green multilayer mother substrate can be performed at a relatively low temperature, and wider selection of the inorganic powders contained in the shrinkage suppression layer can be obtained.

Various changes and modifications can be made in the method and products of this invention without departing from the spirit and scope thereof. The various embodiments set forth herein were for the purpose of illustration the invention and were not intended to limit it.

What is claimed is:

1. A method for manufacturing multilayer ceramic substrates each including ceramic layers laminated to each other, comprising:

providing a green composite laminate comprising a green multilayer mother substrate and a pair of shrinkage suppression layers which are disposed so as to sandwich the green multilayer mother substrate in the lamination direction, wherein the green multilayer mother substrate comprises a plurality of ceramic green layers which contain a sinterable insulating ceramic powder, wherein the green multilayer mother substrate has predetermined dividing lines defining a plurality of multilayer ceramic substrates, wherein the shrinkage suppression layers comprise an inorganic powder which is not sintered at a sintering temperature of the insulating ceramic powder, and wherein the green composite laminate has a plurality of through-holes each of which is disposed on a dividing line so as to penetrate at least the green multilayer mother substrate in the lamination direction;

firing the green composite laminate under the conditions in which the insulating ceramic powder is sintered and the inorganic powder is not sintered to form a sintered multilayer mother substrate between the shrinkage suppression layers;

removing the shrinkage suppression layers;

forming external terminal electrodes of the multilayer ceramic substrates by wet plating the fired multilayer mother substrate from which the shrinkage suppression layer have been removed so as to deposit plating films on the surfaces of the conductors which are exposed at the inside surfaces of the through-holes for; and dividing the sintered multilayer mother substrate along the predetermined dividing lines to form a plurality of multilayer ceramic substrates each having side surfaces including moieties of the inside surfaces of the through-holes, whereby, after dividing the multilayer mother substrate, the conductors are exposed at parts of the side surfaces of the multilayer ceramic substrates corresponding to parts of the inside surfaces of the through-holes so as to form the external terminal electrodes.

2. The method for manufacturing multilayer ceramic substrates according to claim 1, comprising at least one further process selected from the group consisting of preparing ceramic green sheets for forming the ceramic green layers;

preparing inorganic green sheets for forming the shrinkage suppression layers;

laminating ceramic green sheets to each other; and laminating inorganic green sheets so as to sandwich the ceramic green sheets in the lamination direction.

3. The method for manufacturing multilayer ceramic substrates according to claim 1, further comprising providing a penetrating portion in at least one of the ceramic green sheets so as to form a cavity in the multilayer ceramic substrate.

4. The method for manufacturing multilayer ceramic substrates according to claim 1, further comprising forming through-holes in the green multilayer mother substrate between the shrinkage suppression layers.

5. The method for manufacturing multilayer ceramic substrates according to claim 1, further comprising forming apertures in the ceramic green sheets disposed so that the apertures form the through-holes when the ceramic green sheets are laminated.

6. The method for manufacturing multilayer ceramic substrates according to claim 1, further comprising forming the green composite laminate, and providing through-holes so as to divide the conductors.

7. The method for manufacturing multilayer ceramic substrates according to claim 1, wherein the conductors are provided so as to penetrate the green multilayer mother substrate in the lamination direction.

8. The method for manufacturing multilayer ceramic substrates according to claim 1, wherein the conductors are provided so as to extend to a part of the green multilayer mother substrate in the lamination direction.

9. The method for manufacturing multilayer ceramic substrates according to claim 1, wherein the conductors comprise a conductive paste.

10. The method for manufacturing multilayer ceramic substrates according to claim 9, wherein the conductors are at least one member selected from the group consisting of Ag, an Ag—Pt alloy, an Ag—Pd alloy, Cu, Au and Ni.

11. The method for manufacturing multilayer ceramic substrates according to claim 1, further comprising forming conductors, which will become external terminal electrodes, on parts of the side surfaces of the multilayer ceramic substrates formed by dividing the multilayer mother substrate and corresponding to parts of the inside surfaces of the through-holes.

12. The method for manufacturing multilayer ceramic substrates according to claim 1, wherein the through-holes have rectangular cross-sectional shapes, and the longer sides of the cross-sectional shapes are disposed in the directions in which the dividing lines extend.

13. The method for manufacturing multilayer ceramic substrates according to claim 1, further comprising forming cut-in grooves in the green composite laminate along the dividing lines so as to penetrate at least one of the shrinkage suppression layers and to extend to a part of the multilayer mother substrate in the thickness direction, whereby the multilayer mother substrate is divided along the cut-in grooves when dividing the multilayer mother substrate.

14. The method for manufacturing multilayer ceramic substrates according to claim 13, wherein the forming of the cut-in grove is effected after compressing the green composite laminate in the lamination direction.

15. The method for manufacturing multilayer ceramic substrates according to claim 1, wherein dividing the multilayer mother substrate comprises forming cut-in grooves in the sintered multilayer mother substrate along the dividing lines, whereby the sintered multilayer mother substrate is divided along the cut-in groove.

16. The method for manufacturing multilayer ceramic substrates according to claim 1, wherein the ceramic green layers comprises a glass.

17. A method for manufacturing multilayer ceramic substrates each including ceramic layers laminated to each other, comprising:

providing a green composite laminate comprising a green multilayer mother substrate and a pair of shrinkage suppression layers which are disposed so as to sandwich the green multilayer mother substrate in the lamination direction, wherein the green multilayer mother substrate comprises a plurality of ceramic green layers which contain a sinterable insulating ceramic powder, wherein the green multilayer mother substrate has predetermined dividing lines defining a plurality of multilayer ceramic substrates, wherein the shrinkage suppression layers comprise an inorganic powder which is not sintered at a sintering temperature of the insulating ceramic powder, and wherein the green composite laminate has a plurality of through-holes each of which is disposed on a dividing line so as to penetrate at least the green multilayer mother substrate in the lamination direction;

compressing the green composite laminate in he lamination direction and then forming cut-in grooves in the green composite laminate along the dividing lines so as to penetrate at least one of the shrinkage suppression layers and to extend to a part of the multilayer mother substrate in the thickness direction, whereby the multilayer mother substrate is divided alone the cut-in grooves when dividing the multilayer mother substrate;

firing the green composite laminate under the conditions in which the insulating ceramic powder is sintered and the inorganic powder is not sintered to form a sintered multilayer mother substrate between the shrinkage suppression layers;

removing the shrinkage suppression layers; and dividing the sintered multilayer mother substrate along the predetermined dividing lines to form a plurality of multilayer ceramic substrates each having side surfaces including moieties of the inside surfaces of the through-holes, wherein forming the through-holes is performed after the compression step.

18. The method for manufacturing multilayer ceramic substrates according to claim 17, wherein green composite laminate is compressed at a first pressure, the cut-in groove is formed, the resulting green composite laminate is compressed at a second pressure which is higher than the first pressure, and thereafter the through-holes are formed.

* * * * *